(12) United States Patent
Hishikawa et al.

(10) Patent No.: US 9,176,182 B2
(45) Date of Patent: Nov. 3, 2015

(54) I-V CHARACTERISTIC MEASURING APPARATUS AND I-V CHARACTERISTIC MEASURING METHOD FOR SOLAR CELL, AND RECORDING MEDIUM RECORDED WITH PROGRAM FOR I-V CHARACTERISTIC MEASURING APPARATUS

(71) Applicants: National Institute of Advanced Industrial Science and Technology, Tokyo (JP); KYOSHIN ELECTRIC CO., LTD., Kyoto-shi, Kyoto (JP)

(72) Inventors: Yoshihiro Hishikawa, Tsukuba (JP); Haruya Shimura, Tsukuba (JP); Kohei Kamatani, Takatsuki (JP); Hajime Kondo, Kyoto (JP); Akio Shimono, Kyoto (JP)

(73) Assignees: National Institute of Advanced Industrial Science and Technology, Tokyo (JP); KYOSHIN ELECTRIC CO., LTD., Kyoto-shi (JP)

( * ) Notice: Subject to any disclaimer, the term of this patent is extended or adjusted under 35 U.S.C. 154(b) by 159 days.

(21) Appl. No.: 14/141,344

(22) Filed: Dec. 26, 2013

(65) Prior Publication Data

US 2014/0354323 A1 Dec. 4, 2014

(30) Foreign Application Priority Data

Jun. 3, 2013 (JP) .................................. 2013-116826

(51) Int. Cl.
*G01R 31/26* (2014.01)
*G01R 31/40* (2014.01)
*H02S 50/15* (2014.01)

(52) U.S. Cl.
CPC ............ *G01R 31/2605* (2013.01); *H02S 50/00* (2013.01); *H02S 50/15* (2014.12)

(58) Field of Classification Search
CPC ........................... G01R 31/2605; H01L 31/04
USPC ............................................. 324/761.01, 713
See application file for complete search history.

(56) References Cited

U.S. PATENT DOCUMENTS

2011/0320145 A1* 12/2011 Horng et al. .................... 702/65

FOREIGN PATENT DOCUMENTS

JP 2013004664 A 7/2013

* cited by examiner

*Primary Examiner* — Arleen M Vazquez
*Assistant Examiner* — Steven Yeninas
(74) *Attorney, Agent, or Firm* — Alleman Hall McCoy Russell & Tuttle LLP

(57) ABSTRACT

To provide an I-V characteristic measuring apparatus that can, even though a solar simulator of a flash light type is used, accurately measure a true I-V characteristic of a solar cell that exhibits a different I-V characteristic depending on a sweep direction when a sweep time of applied voltage is short, an internal division ratio calculation part that, at each voltage value, calculates an internal division ratio at which a current value of a dark state stationary I-V characteristic internally divides a gap between a current value of a dark state forward I-V characteristic and a current value of a dark state reverse I-V characteristic; and a light state stationary I-V characteristic estimation and calculation part that, on the basis of the internal division ratio, a light state forward I-V characteristic, and a light state reverse I-V characteristic, estimates and calculates a light state stationary I-V characteristic are provided.

7 Claims, 7 Drawing Sheets

I-V CHARACTERISTIC MEASURING APPARATUS AND I-V CHARACTERISTIC MEASURING METHOD FOR SOLAR CELL, AND RECORDING MEDIUM RECORDED WITH PROGRAM FOR I-V CHARACTERISTIC MEASURING APPARATUS

TECHNICAL FIELD

The present invention relates to an I-V characteristic measuring apparatus and I-V characteristic measuring method for measuring an I-V characteristic of a solar cell, and a recording medium recorded with a program for the I-V characteristic measuring apparatus.

BACKGROUND ART

An I-V characteristic of a solar cell is one that shows, for example, maximum power current and maximum power voltage that generate maximum power, and it is an important characteristic for evaluating performance of the solar cell. In the past, an I-V characteristic of a solar cell has been measured by, while irradiating the solar cell with pseudo-sunlight as flash light, sweeping applied voltage to the solar cell between short-circuit current and open-circuit voltage, and measuring current and voltage outputted from the solar cell at the time (see Patent Literature 1).

Meanwhile, in recent years, a highly efficient solar cell such as a hetero junction type solar cell has been used; however, in the case of, for such a highly efficient solar cell, directly using the I-V characteristic measuring method described above that has been used for a conventional single crystalline silicon solar cell, various problems occur.

Specifically, in the case of measuring an I-V characteristic by irradiating a highly efficient solar cell with, for example, flash light having an irradiation time of 0.1 s or less as the pseudo-sunlight, and sweeping applied voltage to the solar cell between short-circuit current to open-circuit voltage according to the irradiation time, the measured I-V characteristic is largely different depending on a direction of the sweep. That is, in the case where a sweep time of the applied voltage is short, the I-V characteristic of the highly efficient solar cell exhibits a hysteresis with respect to the sweep direction of the applied voltage.

The reason why such a hysteresis occurs is because the highly efficient solar cell has large electrostatic capacitance as compared with the single crystalline silicon solar cell, and in the case of shortening the sweep time of the applied voltage, an influence from the electrostatic capacitance appears.

On the other hand, it is known that in the case of measuring the I-V characteristic of the highly efficient solar cell while sufficiently lengthening the sweep time of the applied voltage to the solar cell, a hysteresis as described above hardly appears, and the I-V characteristic having a pattern similar to that of the single crystalline silicon solar cell is exhibited. For this reason, for a solar cell that, in the case of setting a sweep time of applied voltage to a short predetermined time, exhibits a hysteresis with respect to a sweep direction of the applied voltage, the sweep time of the applied voltage is set to a longer time such as 0.5 s or more, and an I-V characteristic measured in a stationary state where a variation of the applied voltage is kept slow is treated as a true value.

However, it is actually difficult to, as described, extend an irradiation time of flash light as pseudo-sunlight, and irradiate a solar cell over a long period of time, in accordance with a lengthened sweep time of applied voltage. More specifically, countries that are major producers of solar cells, I-V characteristic measurement using flash light is mainstream, and therefore the following problems occur.

For example, in the case of generating an arc discharge to irradiate a solar cell with pseudo-sunlight from a solar simulator using a xenon lamp over a long period of time, as an irradiation time is lengthened, a life of the xenon lamp quickly shortens. In that case, on a performance evaluation line for solar cells, replacement of the xenon lamp frequently occurs, and thereby throughput that is the number of solar cells evaluable per unit time is significantly reduced.

Also, in the case of attempting to enable a long time discharge, for example, a time to charge power necessary for a capacitor is also lengthened, which also causes the reduction in throughput. For example, by setting up a plurality of capacitor chargers to alternately charge the capacitors, the throughput can be improved; however, the setup of the plurality of capacitor chargers causes an increase in size of an I-V characteristic measuring apparatus including a solar simulator, and also an increase in manufacturing cost.

Further, solar simulators used on evaluation lines that have conventionally evaluated I-V characteristics of single crystalline silicon solar cells are mostly ones of a flash light type, which are not originally configured to perform irradiation of pseudo-sunlight as stationary light over a long period of time. Accordingly, in the case of attempting to evaluate a highly efficient solar cell by the conventional I-V characteristic measuring method described above, on any of the existing evaluation lines that have evaluated the solar cells, or on any of other lines, the conventional solar simulator should be updated to a solar simulator capable of performing the stationary light irradiation, and therefore there is also a problem of very high introduction cost.

CITATION LIST

Patent Literature

Patent Literature 1: JP-A2013-4664

SUMMARY OF INVENTION

Technical Problem

The present invention is made in consideration of the problems as described above, and intended to provide an I-V characteristic measuring apparatus and I-V characteristic measuring method that can, even though a solar simulator of a flash light type is used, accurately measure a true I-V characteristic of a solar cell such as a hetero junction type solar cell, which in the case where a sweep time of applied voltage is short, exhibits a different I-V characteristic depending on a sweep direction, and a recording medium recorded with a program for the I-V characteristic measuring apparatus.

Solution to Problem

That is, the I-V characteristic measuring apparatus for a solar cell according to the present invention is, as an invention described in a first aspect of the present invention, provided with: a light state forward I-V characteristic storage part that stores a light state forward I-V characteristic that is an I-V characteristic of a solar cell measured in a light state where the solar cell is irradiated with pseudo-sunlight and in a forward sweep mode in which applied voltage to the solar cell is swept from a short-circuit current side to an open-circuit voltage side within a predetermined time; a light state reverse I-V characteristic storage part that stores a light state reverse I-V characteristic that is the I-V characteristic of the solar cell measured in the light state and in a reverse sweep mode in which the applied voltage to the solar cell is swept from the open-circuit voltage side to the short-circuit current side within the predetermined time; a dark state forward I-V characteristic storage part that stores a dark state forward I-V characteristic that is the I-V characteristic of the solar cell measured in a dark state where the solar cell is not irradiated with the pseudo-sunlight and in the forward sweep mode; a dark state reverse I-V characteristic storage part that stores a dark state reverse I-V characteristic that is the I-V characteristic of the solar cell measured in the dark state and in the reverse sweep mode; a dark state stationary I-V characteristic storage part that stores a dark state stationary I-V characteristic that is the I-V characteristic of the solar cell measured in the dark state and in a stationary sweep mode in which the applied voltage to the solar cell is swept between the short-circuit current side and the open-circuit voltage side over a time longer than the predetermined time; an internal division ratio calculation part that, at each voltage value, calculates an internal division ratio at which a current value of the dark state stationary I-V characteristic internally divides a gap between a current value of the dark state forward I-V characteristic and a current value of the dark state reverse I-V characteristic; and a light state stationary I-V characteristic estimation and calculation part that, on a basis of the internal division ratio, the light state forward I-V characteristic, and the light state reverse I-V characteristic, estimates and calculates a light state stationary I-V characteristic that is the I-V characteristic measured in the light state and in the stationary sweep mode.

Note that the "light state" refers to a state where for example, from a solar simulator, irradiation of pseudo-sunlight suitable to measure an I-V characteristic is performed. Specific examples include a state where the solar cell is irradiated with light meeting standards of pseudo-sunlight, which are prescribed by the International Electrotechnical Commission (IEC) or Japanese Industrial Standards (JIS). Also, the "dark state" is a concept including not only a state where the solar cell is not irradiated with light at all but also a state where illumination intensity is at least lower than that in the "light state", and almost constant and stable. That is, in the "dark state", for example, a solar simulator may be brought into a standby state, and in a state where illumination intensity is lowered, lit at constant illumination intensity.

If so, by measuring only the two I-V characteristics in the light state where the irradiation of the pseudo-sunlight is performed by, for example, a solar simulator, i.e., the light state forward I-V characteristic and the light state reverse I-V characteristic for which a sweep time is set within the predetermined time, and measuring the three I-V characteristics in the dark state where the irradiation of the pseudo-sunlight is not performed by the solar simulator, i.e., the dark state forward I-V characteristic, the dark state reverse I-V characteristic, and the dark state stationary I-V characteristic, the light state stationary I-V characteristic considered as a true I-V characteristic of the solar cell can be, without being directly measured, obtained on the basis of the five I-V characteristics.

Next, the reason why the light state stationary I-V characteristic considered as the true I-V characteristic can be obtained from the five measured I-V characteristics described above is qualitatively described.

For example, in the case of a hetero junction type solar cell, depending on a sweep direction or sweep time of applied voltage, a measured I-V characteristic is greatly changed; however, a relative difference obtained by subtracting a current value of a forward I-V characteristic from a current value of a reverse I-V characteristic measured at each voltage value is not so greatly influenced.

That is, in either of the light state and the dark state, in the case where the sweep direction and sweep time of applied voltage to a solar cell are uniformly conditioned, even in the case where an outputted current value has an offset, a similar change appears in an I-V characteristic measured in each of the states.

More specifically, a relationship in current value, which is kept among a set of the measured dark state forward I-V characteristic, dark state reverse I-V characteristic, and dark state stationary I-V characteristic, is also kept among a set of the light state forward I-V characteristic, light state reverse I-V characteristic, and light state stationary I-V characteristic.

From this, the internal division ratio that is a value calculated from the three I-V characteristics measured in the dark state and represents a relationship among graph shapes of the three I-V characteristics can also be used for the respective I-V characteristics measured in the light state in the same manner.

Accordingly, on the basis of the measured light state forward I-V characteristic and light state reverse I-V characteristic, and the internal division ratio, the unknown light state stationary I-V characteristic can be estimated and calculated, and therefore it is not necessary to directly measure the light state stationary I-V characteristic.

In addition, in the measurement of the I-V characteristics in the light state, the sweep time of the applied voltage to the solar cell is set within the predetermined time, so that it is not necessary to keep the pseudo-sunlight as stationary light, and for example, the measurement can be made for a short irradiation time by flash light or the like. Accordingly, it is not necessary to irradiate the solar cell with the stationary light as the pseudo-sunlight, so that even though a conventional solar simulator of a flash light type is directly used, a true I-V characteristic can be accurately measured even for a solar cell having a special I-V characteristic, such as a highly efficient solar cell. For this reason, it is not necessary to introduce new equipment, and it is only necessary to rewrite, for example, a program or the like, so that measurement of an I-V characteristic of a special solar cell can be handled with suppressed introduction costs.

Also, an I-V characteristic of a solar cell can be measured with only flash light, so that a light source used for a solar simulator can be kept from deteriorating, and therefore be continuously used over a long period of time. For this reason, a replacement frequency of the light source used for the solar simulator can be reduced, and therefore throughput that is the number of times of I-V characteristic measurement per unit time can be kept high.

In addition, an I-V characteristic measuring method, which is an invention described in a sixth aspect of the present invention, and a recording medium recorded with a program for the I-V characteristic measuring apparatus, which is an invention described in a seventh aspect of the present invention, can also produce the same effects as those described above.

In order to make it possible to make up, for example, a measuring sequence or the like to efficiently obtain the five I-V characteristics necessary to obtain the light state stationary I-V characteristic, as an invention described in a second aspect of the present invention, it is only necessary that the I-V characteristic measuring apparatus is further provided with: an irradiation control part that controls an irradiation state of the pseudo-sunlight with which a solar simulator irradiates the solar cell; and an applied voltage control part that controls the applied voltage applied to the solar cell by a load power supply, wherein: the irradiation control part is configured to control the solar simulator to achieve either state of the light state and the dark state; and the applied voltage control part is configured to control the load power supply in any sweep mode of the forward sweep mode, the reverse sweep mode, and the stationary sweep mode.

As a predetermined time that makes it possible to, without actual measurement, accurately obtain a light state stationary I-V characteristic of a highly efficient solar cell such as a hetero junction type solar cell, and is suitable to prolong a life of a solar simulator and increase throughput, as an invention described in a third aspect of the present invention, it is only necessary that the predetermined time is set such that an I-V characteristic of the solar cell measured in the forward sweep mode and an I-V characteristic of the solar cell measured in the reverse sweep mode are different from each other.

It is possible to immediately calculate the light state stationary I-V characteristic, preventing the deterioration of a light source used for a solar simulator, and eliminating the need for replacement over a long period of time to increase throughput when irradiating a solar cell with pseudo-sunlight on a solar cell evaluation line. Specific embodiments to achieve this include, as an invention described in a fourth aspect of the present invention, the I-V characteristic measuring apparatus. The I-V characteristic measuring apparatus is further provided with: the solar simulator; the load power supply; and a current voltage measuring mechanism that measures current and voltage that are outputted from the solar cell, wherein the solar simulator is configured to irradiate the solar cell with flash light as the pseudo-sunlight.

In order to make the sweep of the applied voltage to the solar cell less likely to be influenced by, for example, the voltage outputted from the solar cell, or other turbulence, and make the applied voltage to be swept in the most preferable mode to consequently make it possible to obtain the light state stationary I-V characteristic as an accurate value, as an invention described in a fifth aspect of the present invention, it is only necessary that the I-V characteristic measuring apparatus is further provided with a load power supply voltage measuring mechanism that measures load power supply voltage that is voltage outputted from the load power supply. The applied voltage control part is configured to control the load power supply so as to minimize a deviation between an applied voltage target value that is a target value for the applied voltage to be swept and a load power supply measured voltage that is measured by the load power supply voltage measuring mechanism. If so, the solar cell is placed outside a feedback loop that controls the load power supply, so that the influence of the output of the solar cell, or another influence of outside light or the like is not inputted to the load power supply to stabilize control, and therefore applied voltage ideal for I-V characteristic measurement can be swept.

Advantageous Effects of Invention

As described, according to the I-V characteristic measuring apparatus of the present invention, on the basis of the two light state I-V characteristics measured using the pseudo-sunlight of a flash light type, and the three dark state I-V characteristics measured without irradiation of the pseudo-sunlight, the light state stationary I-V characteristic considered as the true I-V characteristic of the solar cell can be obtained. Accordingly, without the need to newly introduce a solar simulator or the like that can perform irradiation of stationary light, a true I-V characteristic of a highly efficient solar cell or the like can be obtained even by an existing I-V characteristic measuring apparatus only by performing an action such as rewriting a program, and therefore introduction costs can be reduced. Also, a solar simulator of a flash light type can be used to reduce a maintenance frequency of the solar simulator, and therefore throughput can also be raised to a high level.

DESCRIPTION OF EMBODIMENTS

An I-V characteristic measuring apparatus 100 according to one embodiment of the present invention is described with reference to the respective drawings.

The I-V characteristic measuring apparatus 100 of the present embodiment is one that is intended to measure an I-V characteristic of a solar cell, and used to, for example, evaluate and classify manufactured solar cells on the basis of characteristics of the solar cells. In the present embodiment, the I-V characteristic measuring apparatus 100 is intended to measure an I-V characteristic of a highly efficient solar cell such as a hetero junction type solar cell as the solar cell.

Characteristics of the solar cell serving as a measuring target include the point that, in the case where at the time the I-V characteristic is measured, a sweep time of applied voltage to the solar cell is shorter than a predetermined time (in the case where a sweep rate is high), the measured I-V characteristic exhibits a hysteresis with respect to a sweep direction of the applied voltage. On the other hand, in the case of taking a sufficient time longer than the predetermined time to sweep the applied voltage, a hysteresis hardly appears, and almost the same I-V characteristic is measured independently of a sweep direction. Also, in the present embodiment, the measuring target is set to the solar cell SC; however, the present invention can also be applied to measurement of an I-V characteristic of a solar cell panel in which a plurality of solar cells SC are combined. That is, in this specification, the solar cell includes both concepts of the solar cell SC and the solar cell panel.

Figure 1:
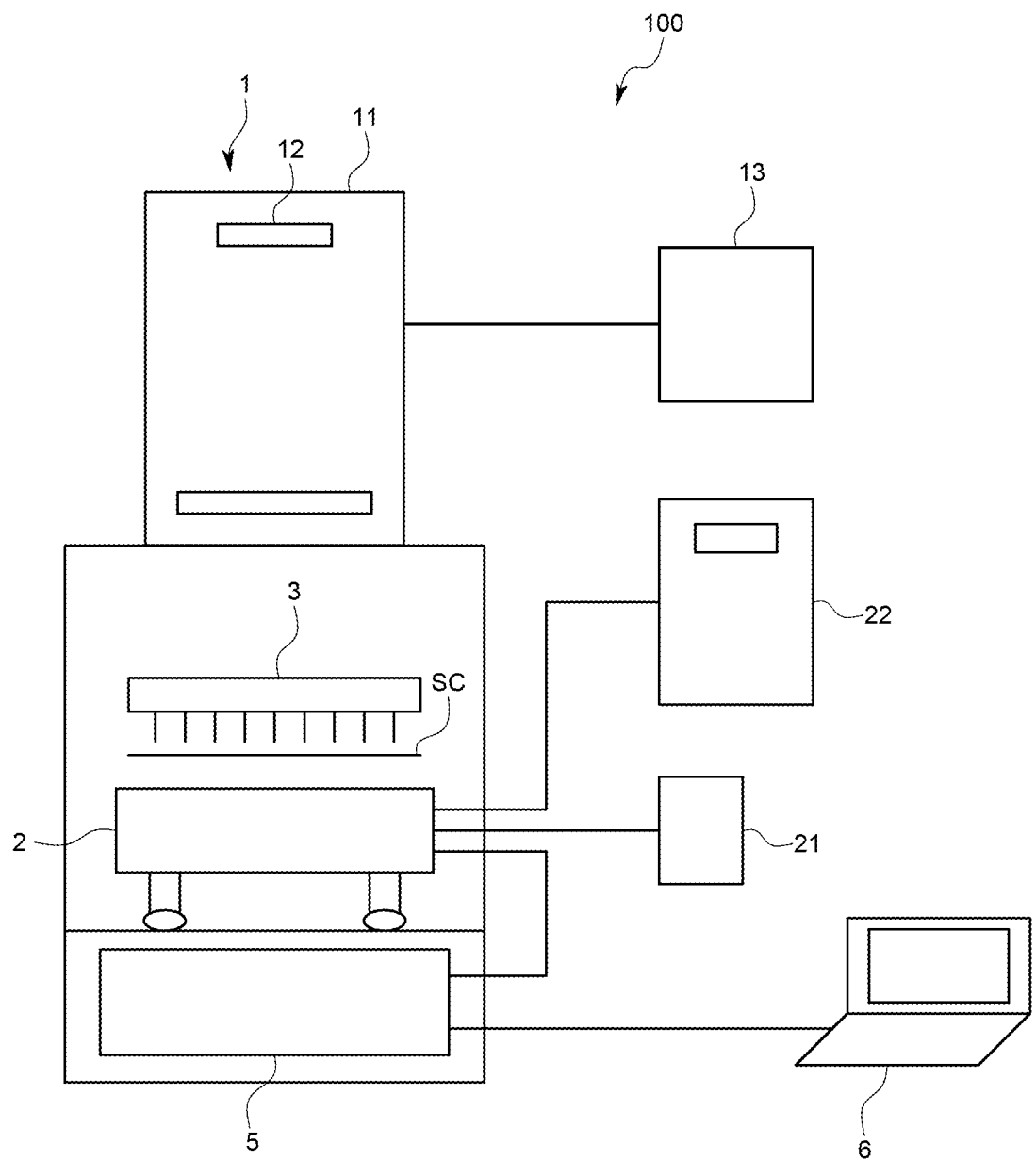
FIG. 1 is a schematic diagram illustrating an overall configuration of an I-V characteristic measuring apparatus according to one embodiment of the present invention.

Next, outlines of respective parts constituting the I-V characteristic measuring apparatus 100 will be described. The I-V characteristic measuring apparatus 100 is one that is, as illustrated in FIG. 1, at least provided with: a solar simulator 1 that irradiates the solar cell SC with pseudo-sunlight; an irradiation control part 13 that controls the solar simulator 1; a sample stage 2 on which the solar cell SC is placed; a probe bar 3 that is brought into contact with a finger electrode or a bus bar electrode formed on a surface of the solar cell SC; an I-V tester 5 that measures the I-V characteristic of the solar cell SC; and a control arithmetic unit 6 (personal computer) that performs control of the respective parts and various types of operations.

The solar simulator 1 is configured to include: a housing 11 having a substantially rectangular parallelepiped shape of which a bottom surface is open; and a light source 12 that is contained on an upper surface side inside the housing 11. The light source 12 is a long arc xenon lamp formed substantially in a ring shape, and it irradiates the solar cell SC with the pseudo-sunlight as flash light (pulsed light). Note that the flash light refers to light of which a light emitting time is set to approximately 0.01 to 0.1 s. In other words, the solar simulator 1 is of a so-called flash light type, and as opposed to a stationary light type, is adapted to perform the irradiation of the pseudo-sunlight only for an irradiation time suitable to keep a life of the light source 12 long.

The irradiation control part 13 controls an irradiation state of the pseudo-sunlight with which the solar simulator 1 irradiates the solar cell SC.

More specifically, the irradiation control part 13 is configured to control the solar simulator 1 so as to achieve either state of a light state where the solar cell SC is irradiated with the pseudo-sunlight and a dark state where the solar cell SC is not irradiated with the pseudo-sunlight. In the light state, the irradiation control part 13 makes the solar simulator 1 emit light only for a predetermined light emission time, whereas in the dark state, the irradiation control part 13 performs control such that the solar simulator 1 keeps a completely extinguished state.

The sample stage 2 is connected to a vacuum pump 21 so as to be able to suck and retain a back surface of the solar cell SC, and is also cooled by a chiller 22 in order to, at the time the I-V characteristic is measured, keep a temperature of the solar cell SC constant at a temperature recommended as a measuring condition. Note that, in the present embodiment, the solar simulator 1 is of the flash light type, so that an amount of heat applied to the solar cell SC by the irradiation of the pseudo-sunlight can be made small as compared with the stationary light type solar simulator, and the temperature control by the chiller 22 can also be accurately performed with energy being saved. Further, the present embodiment is adapted to, in a state where the solar cell SC is placed on the sample stage 2 and the probe bar 3 is brought into contact with the surface of the solar cell SC, form an I-V characteristic measuring circuit as illustrated in FIG. 2.

Figure 2:
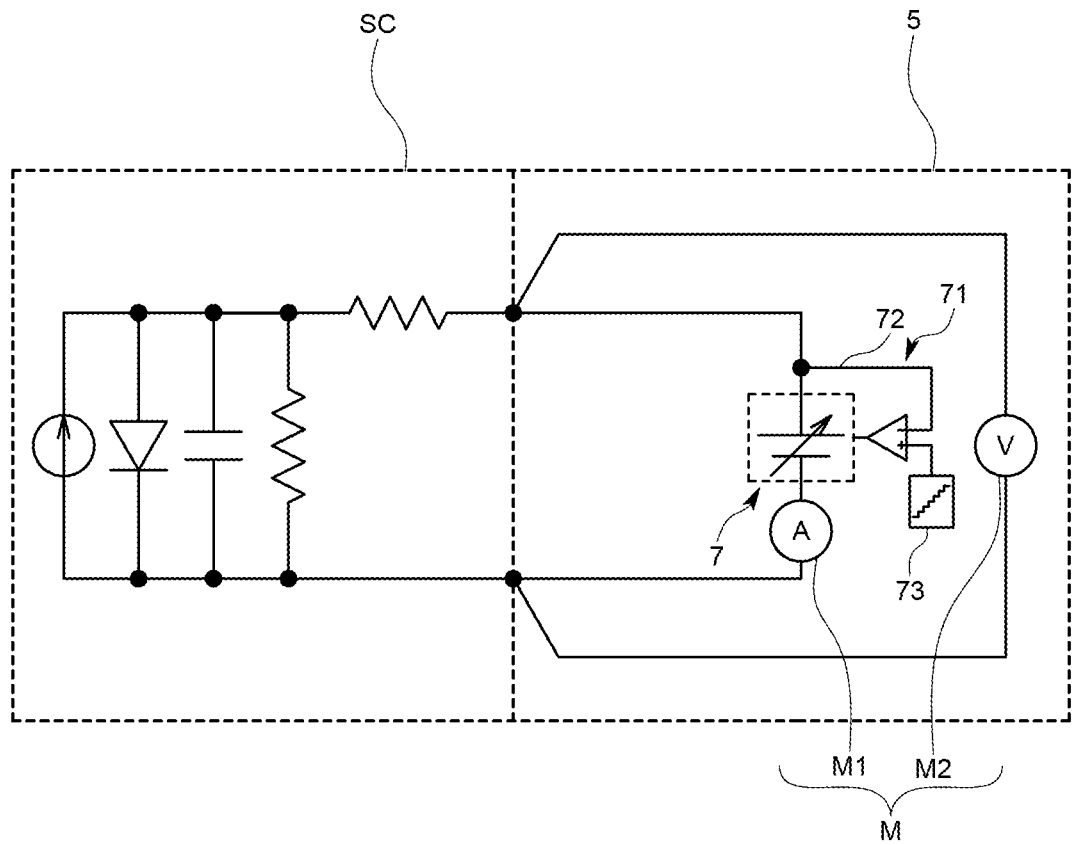
FIG. 2 is a schematic circuit diagram illustrating a configuration of a measuring circuit in the same embodiment.

More specifically, in the I-V characteristic measuring circuit illustrated in FIG. 2, the left half is a circuit illustrating electrical characteristics of the solar cell SC, whereas the right half is a circuit configured to include the I-V tester 5 and the probe bar 3. That is, the I-V characteristic measuring circuit is a circuit that, with use of the I-V tester 5 and probe bar 3, measures current and voltage outputted from the solar cell SC by the four-probe method.

The I-V tester 5 is one that is, in the case where the solar cell SC is placed on the sample stage 2, electrically connected to the solar cell SC, and also at least provided with: a load power supply 7 that sweeps applied voltage to the solar cell SC; an applied voltage control part 71 that controls the voltage applied to the solar cell SC by the load power supply 7; and a current voltage measuring mechanism M including an ammeter M1 and voltmeter M2 that measure the current and voltage outputted from the solar cell SC while the applied voltage to the solar cell SC is swept by the load power supply 7.

The applied voltage control part 71 is a part utilized by a control board inside the I-V tester 5, and at the time the I-V characteristic of the solar cell SC is measured, it controls the applied voltage applied to the solar cell SC by the load power supply 7. More specifically, the applied voltage control part 71 is configured to control the load power supply 7 in any sweep mode of: a forward sweep mode in which the applied voltage is swept from a short-circuit current $I_{SC}$ side to an open-circuit voltage $V_{OC}$ side within a predetermined time; a reverse sweep mode in which the applied voltage is swept from the open-circuit voltage $V_{OC}$ side to the short-circuit current $I_{SC}$ side within the predetermined time; and a stationary sweep mode in which the applied voltage is swept between the short-circuit current $I_{SC}$ side and the open-circuit voltage $V_{OC}$ side over a time longer than the predetermined time.

Note that the predetermined time is set shorter than the light emitting time during which the solar simulator 1 is made to emit the light. Also, in the case of measuring the highly efficient solar cell such as a hetero-junction type solar cell for the predetermined time, the I-V characteristic of the solar cell SC measured in the forward sweep mode and the I-V characteristic of the solar cell SC measured in the reverse sweep mode are different from each other. That is, the predetermined time is a time that is short to the extent that the I-V characteristic of the solar cell SC exhibits a hysteresis with respect to a sweep direction.

On the other hand, in the stationary sweep mode, a sweep time of the applied voltage is a time longer than the predetermined time, and set to a time that is enough for the hysteresis with respect to the sweep direction to hardly appear in the I-V characteristic of the solar cell SC.

Figure 4:
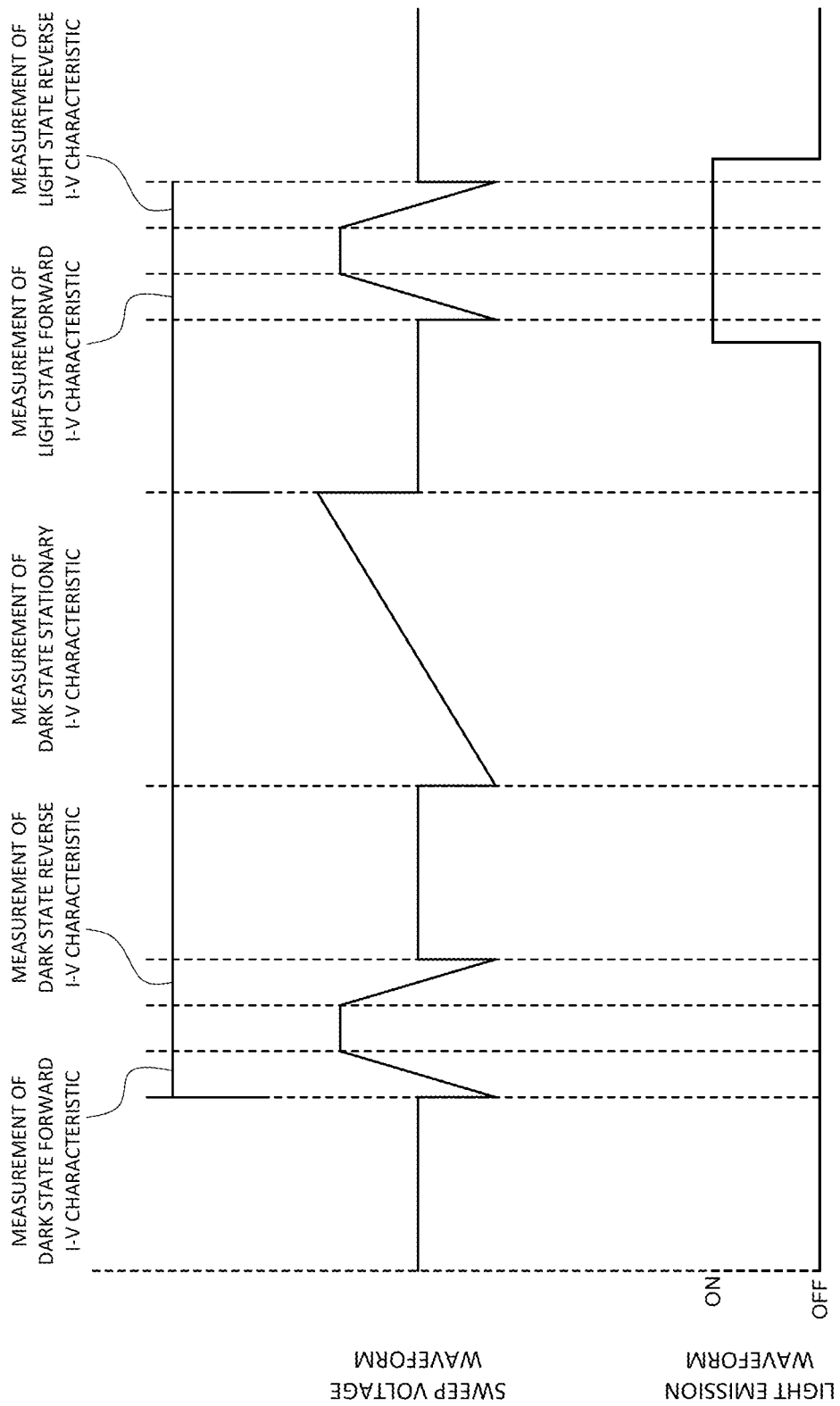
FIG. 4 is a time chart illustrating operation at the time an I-V characteristic is measured in the same embodiment.

Further, the present embodiment is adapted such that the irradiation control part 13 and the applied voltage control part 71 cooperate with each other to be thereby, for example, able to measure I-V characteristics of five sets in which combinations of an irradiation state and a sweep mode are different from one another, as illustrated in a timing chart of FIG. 4. More specifically, first, in the dark state, three sets of I-V characteristics are measured in the forward sweep mode, reverse sweep mode, and stationary sweep mode, respectively, and then, in the light state, two sets of I-V characteristics are measured in the forward sweep mode, and reverse sweep mode, respectively.

As is clear by referring to FIG. 4, in either of the light state and the dark state, sweep times of the applied voltage to the solar cell SC, and voltage ranges to be varied in the forward sweep mode and the reverse sweep mode, are made uniform, and measuring conditions other than the irradiation state are adapted to be made as uniform as possible.

As illustrated in the circuit diagram of FIG. 2, the applied voltage control part 71 is provided with: a load power supply voltage measuring mechanism 72 that measures load power supply voltage that is the voltage outputted from the load power supply 7; and a command value generating part 73 that generates the applied voltage target value that is the target value for the applied voltage to be swept, and is adapted to feed a deviation between the load power supply voltage and the applied voltage target value back to the load power supply 7.

In FIG. 4, for the purpose of visibility, a change in a sweep voltage waveform is represented by a straight line in a sweep section; however, regarding an actual sweep command, the applied voltage target value that changes stepwise is inputted. More specifically, the applied voltage control part 71 is configured to control the load power supply 7 so as to minimize the deviation between the applied voltage target value that is the target value for the applied voltage to be swept and the load power supply measured voltage that is measured by the load power supply voltage measuring mechanism 72.

The load power supply voltage measuring mechanism 72 is set at a position closer to the load power supply 7 than a measuring point of the voltmeter M2 of the current voltage measuring mechanism M, and adapted such that the output from the solar cell SC is not inputted to a feedback system for the load power supply 7. Also, between the measuring point of the load power supply voltage measuring mechanism 72 and the measuring point of the voltmeter M2, a sufficient wiring distance is ensured.

That is, feedback control for sweeping the applied voltage does not use the voltage that is measured by the current voltage measuring mechanism M and outputted from the solar cell SC. Accordingly, a feedback loop system for sweeping the applied voltage is, without being influenced by the output from the solar cell SC, adapted to refer to only the voltage outputted from the load power supply 7 to make the load power supply 7 provide an output approximately equal to the applied voltage target value. The feedback system is configured as described above, so that the control can be stabilized to realize ideal I-V characteristic measurement, and consequently the I-V characteristic measurement can be made accurate.

Further, the I-V tester 5 is one that, on the basis of the outputs of the solar cell SC, which are measured by the ammeter M1 and voltmeter M2 in the circuit diagram of FIG. 2, creates data on the I-V characteristic of the solar cell SC, and plots the data on a display screen of the control arithmetic unit 6 as a graph.

Figure 3:
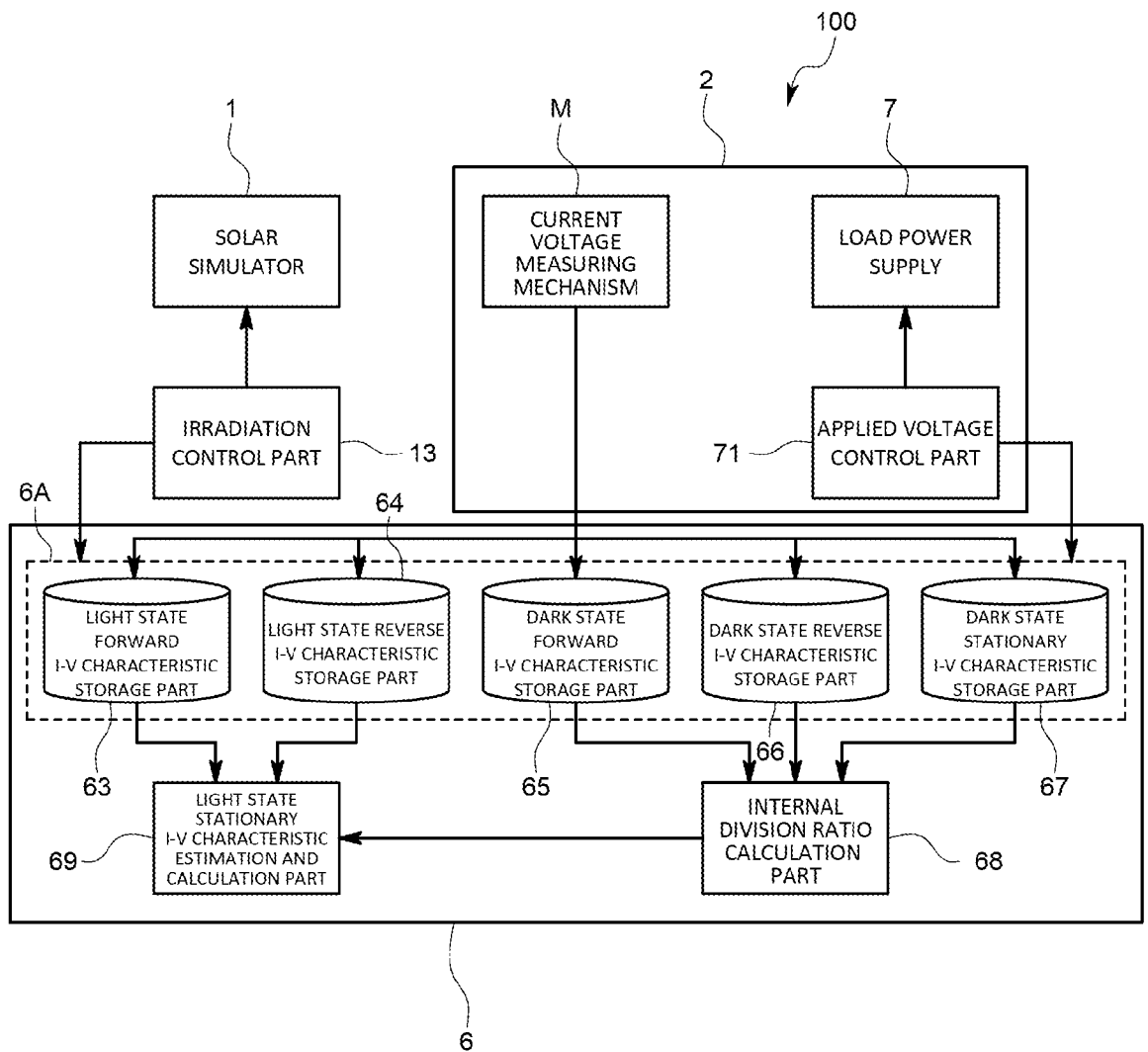
FIG. 3 is a functional block diagram illustrating a configuration of a calculation part in the same embodiment.

The control arithmetic unit 6 is a computer provided with a CPU, memory, display device, input/output means, A/D and D/A converters, and the like, and is configured to execute a program stored in the memory to thereby fulfill functions as, as illustrated in a functional block diagram of FIG. 3, at least an I-V characteristic measurement result storage part 6A, an internal division ratio calculation part 68, and a light state stationary I-V characteristic estimation and calculation part 69.

The respective parts are herein described in detail.

The I-V characteristic measurement result storage part 6A is one that obtains an irradiation state set by the irradiation control part 13 and a sweep mode set by the applied voltage control part 71, and stores an I-V characteristic measured for each of combinations of the irradiation state and the sweep mode. More specifically, as illustrated in FIG. 3, the I-V characteristic measurement result storage part 6A includes a light state forward I-V characteristic storage part 63, a light state reverse I-V characteristic storage part 64, a dark state forward I-V characteristic storage part 65, a dark state reverse I-V characteristic storage part 66, and a dark state stationary I-V characteristic storage part 67, which are parts that respectively store I-V characteristics under different measuring conditions. Note that there are the two different irradiation states, and three different sweep modes, and therefore six different sets of measuring conditions are possible; however, an I-V characteristic in the light state and in the stationary sweep mode is not measured because the present embodiment uses the solar simulator 1 of the flash light type.

The light state forward I-V characteristic storage part 63 stores a light state forward I-V characteristic PIV that is an I-V characteristic of the solar cell SC measured in the light state and in the forward sweep mode by the current voltage measuring mechanism M.

The light state reverse I-V characteristic storage part 64 stores a light state reverse I-V characteristic PVI that is the I-V characteristic of the solar cell SC measured in the light state and in the reverse sweep mode by the current voltage measuring mechanism M.

The dark state forward I-V characteristic storage part 65 stores a dark state forward I-V characteristic DIV that is the I-V characteristic of the solar cell SC measured in the dark state and in the forward sweep mode by the current voltage measuring mechanism M.

The dark state reverse I-V characteristic storage part 66 stores a dark state reverse I-V characteristic DVI that is the I-V characteristic of the solar cell SC measured in the dark state and in the reverse sweep mode by the current voltage measuring mechanism M.

The dark state stationary I-V characteristic storage part 67 stores a dark state stationary I-V characteristic DST that is the I-V characteristic of the solar cell SC measured in the dark state and in the stationary sweep mode by the current voltage measuring mechanism M.

Figure 5:
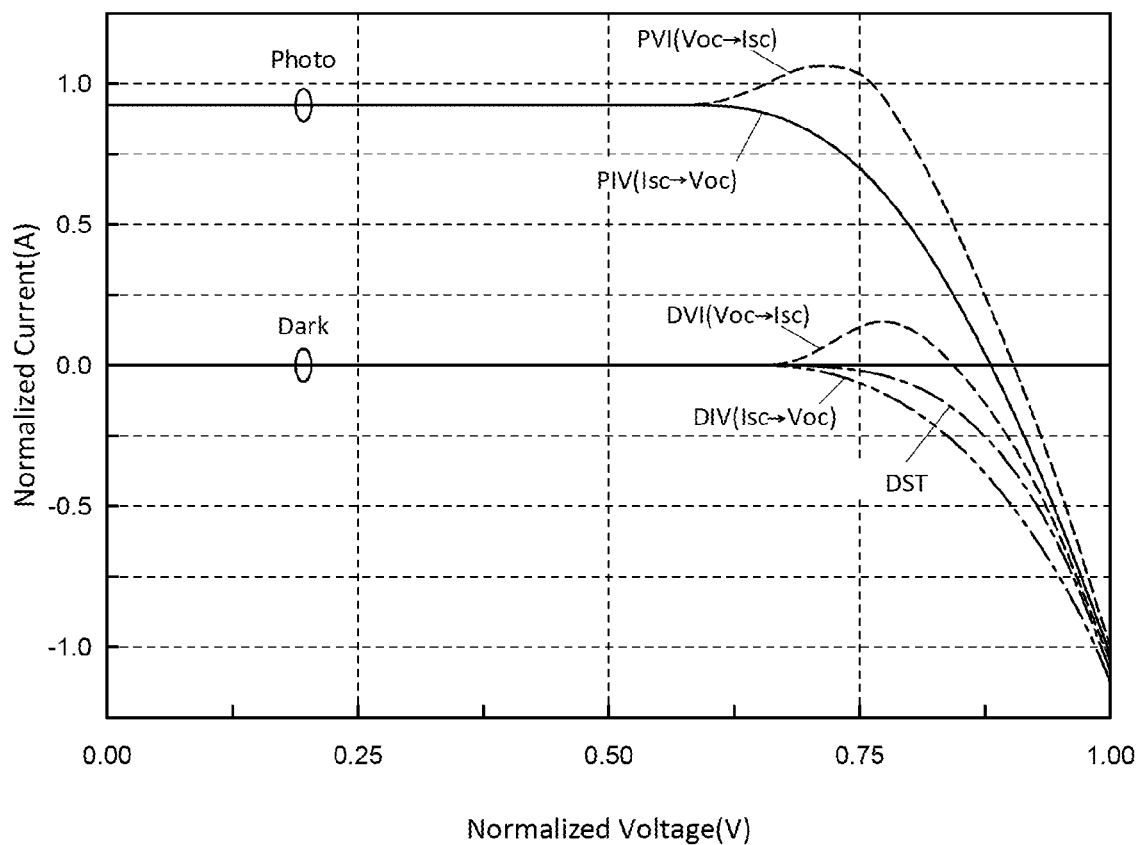
FIG. 5 is a graph illustrating an example of measurement results of five I-V characteristics in the same embodiment.

Illustrated here are an example of each of the measured I-V characteristics stored in the I-V characteristic measurement result storage part 6A with results graphed in FIG. 5. As can be seen from the I-V characteristics measured in the dark state, which are illustrated in FIG. 5, in the case of referring to the vicinity of a maximum power point, the forward I-V characteristic, stationary I-V characteristic, and reverse I-V characteristic are plotted from a lower side in this order, and this tendency holds, regardless of an irradiation state. Also, it turns out that between the light state and the dark state, an offset occurs at current values, but an outer shape of a graph exhibits a similar tendency. Further, an unmeasured light state stationary I-V characteristic PST that is the I-V characteristic supposed to be measured in the light state and in the stationary sweep mode appears to internally divide an area between the light state forward I-V characteristic PIV and the light state reverse I-V characteristic PVI.

The internal division ratio calculation part 68 and the light state stationary I-V characteristic estimation and calculation part 69, which will be described below in detail, are configured to calculate the unmeasured light state stationary I-V characteristic PST on the basis of the five measured I-V characteristics.

Figure 6:
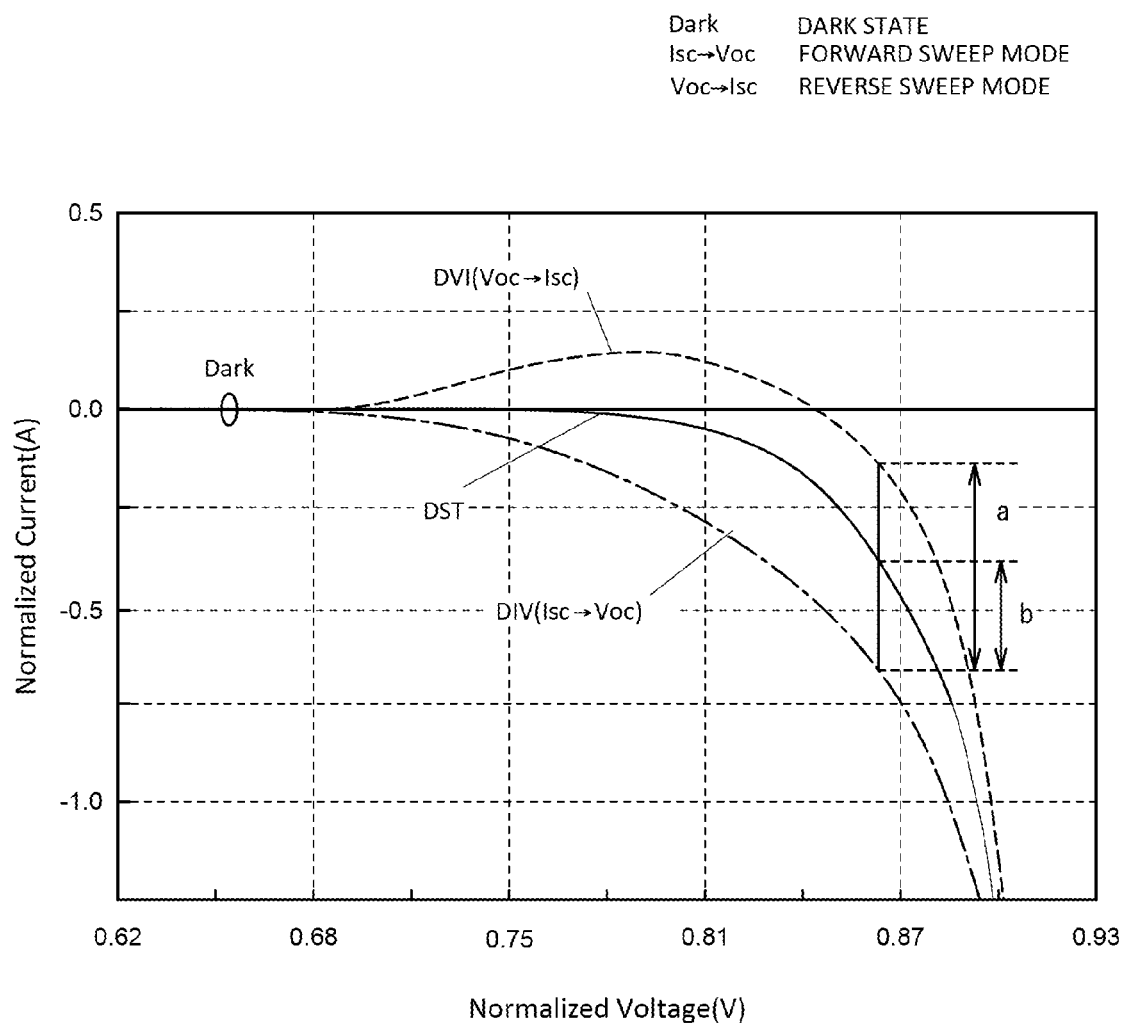
FIG. 6 is a graph illustrating an internal division ration that is calculated from the I-V characteristics measured in a dark state in the same embodiment.

The internal division ratio calculation part 68 calculates an internal division ratio at which, as illustrated in a graph of FIG. 6, at each voltage value, the current value of the dark state stationary I-V characteristic DST internally divides a gap between the current value of the dark state forward I-V characteristic DIV and the current value of the dark state reverse I-V characteristic DVI. In the present embodiment, the internal division ratio calculation part 68 is configured to, at each voltage value, calculate an internal division ratio of b/a between a that is a value obtained by subtracting the current value of the dark state forward I-V characteristic DIV from the current value of the dark state reverse I-V characteristic and b that is a value obtained by subtracting the current value of the dark state forward I-V characteristic DIV from the current value of the dark state stationary I-V characteristic DST. In addition, for a voltage value section where division by zero occurs, the internal division ratio is treated as 1.

Figure 7:
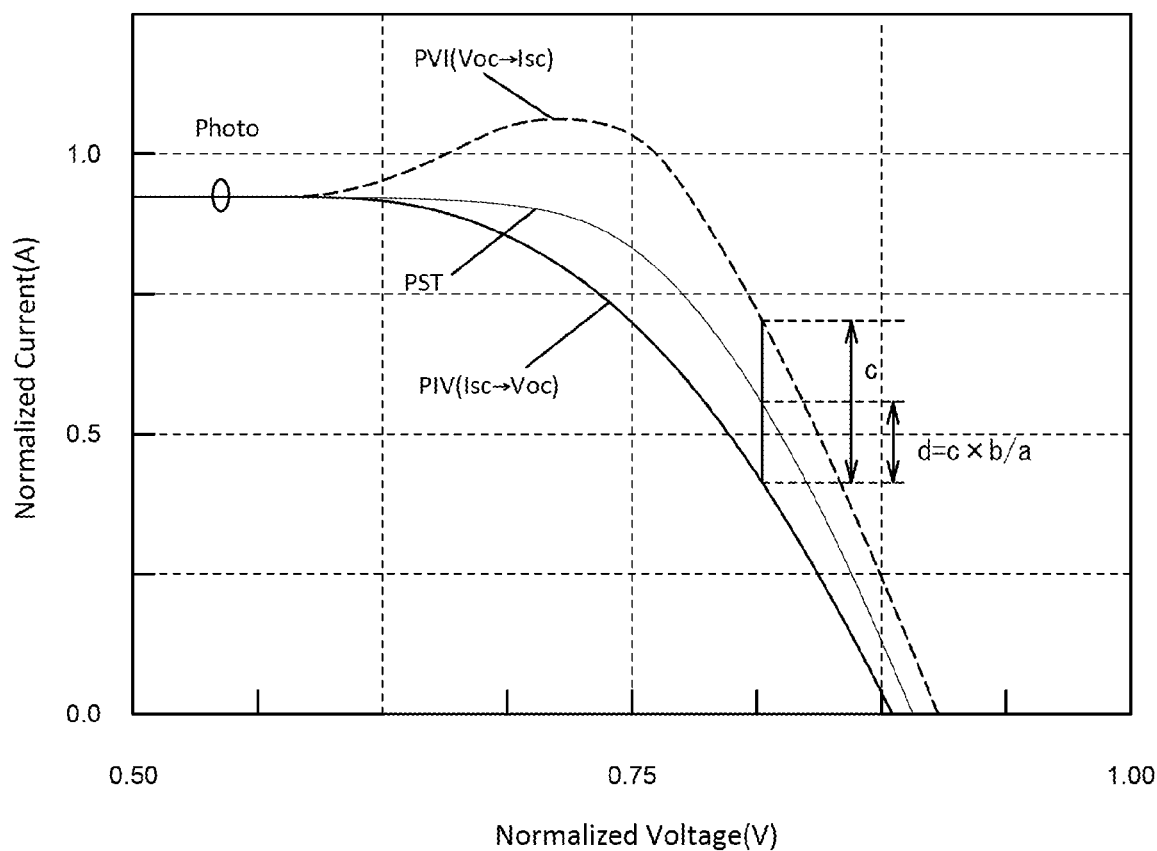
FIG. 7 is a graph illustrating a light state stationary I-V characteristic calculated in the same embodiment.

The light state stationary I-V characteristic estimation and calculation part 69 estimates and calculates, on the basis of the internal division ratio, the light state forward I-V characteristic PIV, and the light state reverse I-V characteristic PVI, the light state stationary I-V characteristic PST that is the I-V characteristic supposed to be measured in the light state and in the stationary sweep mode. More specifically, the light state stationary I-V characteristic estimation and calculation part 69 calculates c, a value obtained by subtracting the current value of the light state forward I-V characteristic PIV from the current value of the light state reverse I-V characteristic PVI at each voltage value, and multiplies c at each voltage value by the internal division value b/a at the voltage value to obtain a correction amount d. Further, the light state stationary I-V characteristic estimation and calculation part 69 is adapted to, as illustrated in a graph in FIG. 7, add the correction amount to the current value of the light state forward I-V characteristic PIV at the voltage value to output a resultant value as the light state stationary I-V characteristic PST.

As described, according to the I-V characteristic measuring apparatus 100 of the present embodiment, without using a stationary light type solar simulator, with the solar simulator 1 of the flash light type, the light state stationary I-V characteristic PST can be estimated and calculated.

Accordingly, the light state stationary I-V characteristic PST that is a true I-V characteristic of the solar cell SC that exhibits a hysteresis depending on a sweep direction in the case where a sweep time of applied voltage is short as in the case of a hetero-junction type solar cell can still be obtained, even though the existing solar simulator 1 of the flash light type, which has been introduced on an evaluation line for solar cells SC, is used as is.

Also, in order to measure an I-V characteristic, it is not necessary to perform irradiation of pseudo-sunlight over a long period of time in a stationary manner, but it is only necessary to perform a short time irradiation, so that the light source 12 will deteriorate more slowly and will not have to be replaced as frequently. Accordingly, on the evaluation lines for solar cells SC, a ratio of a time to replace the light source 12 to the entire processing time can be reduced to improve throughput such as the number of evaluated solar cells per unit time.

Other embodiments are described below.

In the embodiment described above, the I-V characteristic measuring apparatus 100 is configured to estimate and calculate the light state stationary I-V characteristic PST by measuring the I-V characteristics under the respective measuring conditions directly and, estimating and calculating the light state stationary I-V characteristic PST on the basis of the pieces of measured data. However, for example, for necessary measured values of the I-V characteristics, ones measured by another measuring apparatus may be used. That is, the I-V characteristic measuring apparatus 100 may be configured to include only the I-V characteristic measurement result storage part 6A, the internal division ratio calculation part 68, and the light state stationary I-V characteristic estimation and calculation part 69. In addition, the irradiation control part 13 and the applied voltage control part 71 in the embodiment described above are configured as bodies separated from the control arithmetic unit 6, but may be configured to be integrated with the control arithmetic unit 6.

Also, in order to make an existing I-V characteristic measuring apparatus 100 fulfill functions as the I-V characteristic measurement result storage part 6A, the internal division ratio calculation part 68, the light state stationary I-V characteristic estimation and calculation part 69, and a program for the I-V characteristic measuring apparatus 100 of the present invention may be installed in the existing I-V characteristic measuring apparatus 100 through a program recording medium or the like, such as a CD or a DVD, recorded with the program for the I-V characteristic measuring apparatus 100 of the present invention. In short, the present invention may be configured to calculate the light state stationary I-V characteristic PST from the pieces of data indicating the five I-V characteristics that can be measured without use of pseudo-sunlight as stationary light.

In the embodiment described above, the five I-V characteristics are measured in the order illustrated in the timing chart in FIG. 4. However, in the present invention, it is not necessary to measure the respective I-V characteristics in this order. As long as there are five I-V characteristics as described in the embodiment, in which the combinations of an irradiation condition and a sweep mode are different from one another, the light state stationary I-V characteristic PST considered as the true I-V characteristic can be obtained. Also, a time interval or the like illustrated in the timing chart in FIG. 4 is illustrated for descriptive convenience, and the time interval or the like suitable to measure an I-V characteristic is only required to be appropriate, but is not limited to one illustrated in FIG. 4. Further, in the timing chart in FIG. 4, the dark state stationary I-V characteristic DST is measured in the forward sweep mode in which the applied voltage is swept from the short-circuit current $I_{SC}$ side to the open-circuit voltage $V_{OC}$ side. However, the measurement may be made in the reverse sweep mode. This is because as long as a sweep time of the applied voltage is set sufficiently long, almost the same I-V characteristic can be obtained regardless of a sweep direction. Also, in the embodiment described above, during the one-time pseudo-sunlight irradiation, both the light state forward I-V characteristic PIV and the light state reverse I-V characteristic PVI are measured. However, the present invention may be adapted to perform irradiation of the pseudo-sunlight twice to separately measure the forward and reverse I-V characteristics. In addition, at the time an I-V characteristic is measured in one light state, the present invention may keep performing irradiation of flash light, or set an irradiation time to an extremely short time to sweep applied voltage while performing irradiation a plurality of times, and measure a light state I-V characteristic. Further, as the sweep time of the applied voltage, or the irradiation time of the pseudo-sunlight, 0.01 to 0.1 s is exemplified as the predetermined time suitable to produce the effects of the present invention; however, the predetermined time is only required to be equal to 0.1 s or less.

The method for calculating the internal division ratio, which is described in the embodiment described above, is only one example. In another example, the internal division ratio may be calculated using, as a, a value obtained by subtracting a current value of the dark state forward I-V characteristic DST from the current value of the dark state stationary I-V characteristic DST, and as b, the value obtained by subtracting the current value of the dark state stationary I-V characteristic DST from the current value of the dark state reverse I-V characteristic DVI. Another method entirely may be possible.

The hetero junction type solar cell is cited as an example of a solar cell preferably used for the present invention. However, the present invention can produce the same effects for another solar cell with which an I-V characteristic exhibits a hysteresis depending on a sweep direction of applied voltage.

Various modifications and combinations of the embodiments can be made unless contrary to the scope of the present invention.

REFERENCE CHARACTER LIST

100: I-V characteristic measuring apparatus
1: Solar simulator
2: Sample stage
11: Lamp house
12: Light source
13: Irradiation control part
21: Vacuum pump
22: Chiller
3: Probe bar
5: I-V tester 6: Control arithmetic unit
63: Light state forward I-V characteristic storage part
64: Light state reverse I-V characteristic storage part
65: Dark state forward I-V characteristic storage part
66: Dark state reverse I-V characteristic storage part
67: Dark state stationary I-V characteristic storage part
68: Internal division ratio calculation part
69: Light state stationary I-V characteristic estimation and calculation part
71: Applied voltage control part
72: Load power supply voltage measuring mechanism
73: Command value generating part
PIV: Light state forward I-V characteristic
PVI: Light state reverse I-V characteristic
PST: Light state stationary I-V characteristic
DIV: Dark state forward I-V characteristic
DVI: Dark state reverse I-V characteristic
DST: Dark state reverse I-V characteristic
SC: Solar cell
M: Current voltage measuring mechanism
M1: Ammeter
M2: Voltmeter

The invention claimed is:

1. An I-V characteristic measuring apparatus for a solar cell comprising:
a light state forward I-V characteristic storage part that stores a light state forward I-V characteristic that is an I-V characteristic of the solar cell measured in a light state where the solar cell is irradiated with pseudo-sunlight and in a forward sweep mode in which applied voltage to the solar cell is swept from a short-circuit current side to an open-circuit voltage side within a predetermined time;
a light state reverse I-V characteristic storage part that stores a light state reverse I-V characteristic that is an I-V characteristic of the solar cell measured in the light state and in a reverse sweep mode in which the applied voltage to the solar cell is swept from the open-circuit voltage side to the short-circuit current side within the predetermined time;
a dark state forward I-V characteristic storage part that stores a dark state forward I-V characteristic that is an I-V characteristic of the solar cell measured in a dark state where the solar cell is not irradiated with the pseudo-sunlight and in the forward sweep mode;
a dark state reverse I-V characteristic storage part that stores a dark state reverse I-V characteristic that is an I-V characteristic of the solar cell measured in the dark state and in the reverse sweep mode;
a dark state stationary I-V characteristic storage part that stores a dark state stationary I-V characteristic that is an I-V characteristic of the solar cell measured in the dark state and in a stationary sweep mode in which the applied voltage to the solar cell is swept between the short-circuit current side and the open-circuit voltage side over a time longer than the predetermined time;
an internal division ratio calculation part that, at each voltage value, calculates an internal division ratio at which a current value of the dark state stationary I-V characteristic internally divides a gap between a current value of the dark state forward I-V characteristic and a current value of the dark state reverse I-V characteristic; and
a light state stationary I-V characteristic estimation and calculation part that, on a basis of the internal division ratio, the light state forward I-V characteristic, and the light state reverse I-V characteristic, estimates and calculates a light state stationary I-V characteristic that is an I-V characteristic measured in the light state and in the stationary sweep mode.

2. The I-V characteristic measuring apparatus according to claim 1, further comprising:
an irradiation control part that controls an irradiation state of the pseudo-sunlight with which a solar simulator irradiates the solar cell; and an applied voltage control part that controls the applied voltage applied to the solar cell by a load power supply, wherein:
the irradiation control part is configured to control the solar simulator to achieve either state of the light state and the dark state; and
the applied voltage control part is configured to control the load power supply in any sweep mode of the forward sweep mode, the reverse sweep mode, and the stationary sweep mode.

3. The I-V characteristic measuring apparatus according to claim 1, wherein
the predetermined time is set such that an I-V characteristic of the solar cell measured in the forward sweep mode and an I-V characteristic of the solar cell measured in the reverse sweep mode are different from each other.

4. The I-V characteristic measuring apparatus according to claim 2, further comprising:
the solar simulator; the load power supply; and a current voltage measuring mechanism that measures current and voltage that are outputted from the solar cell, wherein
the solar simulator is configured to irradiate the solar cell with flash light as the pseudo-sunlight.

5. The I-V characteristic measuring apparatus according to claim 2, further comprising
a load power supply voltage measuring mechanism that measures a load power supply voltage that is voltage outputted from the load power supply, wherein
the applied voltage control part is configured to control the load power supply so as to minimize a deviation between an applied voltage target value that is a target value for the applied voltage to be swept and a load power supply measured voltage that is measured by the load power supply voltage measuring mechanism.

6. An I-V characteristic measuring method for a solar cell, the method comprising:
measuring a light state forward I-V characteristic that is an I-V characteristic of the solar cell measured in a light state where the solar cell is irradiated with pseudo-sunlight and in a forward sweep mode in which applied voltage to the solar cell is swept from a short-circuit current side to an open-circuit voltage side within a predetermined time;
measuring a light state reverse I-V characteristic that is an I-V characteristic of the solar cell measured in the light state and in a reverse sweep mode in which the applied voltage to the solar cell is swept from the open-circuit voltage side to the short-circuit current side within the predetermined time;
measuring a dark state forward I-V characteristic that is an I-V characteristic of the solar cell measured in a dark state where the solar cell is not irradiated with the pseudo-sunlight and in the forward sweep mode;
measuring a dark state reverse I-V characteristic that is an I-V characteristic of the solar cell measured in the dark state and in the reverse sweep mode;
measuring a dark state stationary I-V characteristic that is an I-V characteristic of the solar cell measured in the dark state and in a stationary sweep mode in which the applied voltage to the solar cell is swept between the short-circuit current side and the open-circuit voltage side over a time longer than the predetermined time;

calculating an internal division ratio at which a current value of the dark state stationary I-V characteristic internally divides a gap between a current value of the dark state forward I-V characteristic and a current value of the dark state reverse I-V characteristic at each voltage value; and estimating and calculating a light state stationary I-V characteristic that is an I-V characteristic measured in the light state and in the stationary sweep mode on a basis of the internal division ratio, the light state forward I-V characteristic, and the light state reverse I-V characteristic.

7. A recording medium recorded with a program used for an I-V characteristic measuring apparatus for a solar cell, the I-V characteristic measuring apparatus comprising:

a light state forward I-V characteristic storage part that stores a light state forward I-V characteristic that is an I-V characteristic of the solar cell measured in a light state where the solar cell is irradiated with pseudo-sunlight and in a forward sweep mode in which applied voltage to the solar cell is swept from a short-circuit current side to an open-circuit voltage side within a predetermined time;

a light state reverse I-V characteristic storage part that stores a light state reverse I-V characteristic that is an I-V characteristic of the solar cell measured in the light state and in a reverse sweep mode in which the applied voltage to the solar cell is swept from the open-circuit voltage side to the short-circuit current side within the predetermined time;

a dark state forward I-V characteristic storage part that stores a dark state forward I-V characteristic that is an I-V characteristic of the solar cell measured in a dark state where the solar cell is not irradiated with the pseudo-sunlight and in the forward sweep mode;

a dark state reverse I-V characteristic storage part that stores a dark state reverse I-V characteristic that is an I-V characteristic of the solar cell measured in the dark state and in the reverse sweep mode; and a dark state stationary I-V characteristic storage part that stores a dark state stationary I-V characteristic that is an I-V characteristic of the solar cell measured in the dark state and in a stationary sweep mode in which the applied voltage to the solar cell is swept between the short-circuit current side and the open-circuit voltage side over a time longer than the predetermined time, wherein the program used for an I-V characteristic measuring apparatus fulfills functions as:

an internal division ratio calculation part that, at each voltage value, calculates an internal division ratio at which a current value of the dark state stationary I-V characteristic internally divides a gap between a current value of the dark state forward I-V characteristic and a current value of the dark state reverse I-V characteristic; and a light state stationary I-V characteristic estimation and calculation part that, on a basis of the internal division ratio, the light state forward I-V characteristic, and the light state reverse I-V characteristic, estimates and calculates a light state stationary I-V characteristic that is an I-V characteristic measured in the light state and in the stationary sweep mode.

* * * * *